(12) United States Patent
Finnäs et al.

(10) Patent No.: US 11,571,800 B2
(45) Date of Patent: Feb. 7, 2023

(54) COOLING ARRANGEMENT FOR A POWER TOOL AND POWER TOOL ELECTRONICS

(71) Applicant: Mirka Ltd, Jepua (FI)

(72) Inventors: Stig Finnäs, Sundby (FI); Caj Nordström, Jepua (FI); Tomas Södergård, Nykarleby (FI)

(73) Assignee: MIRKA LTD, Jepua (FI)

( * ) Notice: Subject to any disclaimer, the term of this patent is extended or adjusted under 35 U.S.C. 154(b) by 791 days.

(21) Appl. No.: 16/475,388

(22) PCT Filed: Feb. 28, 2017

(86) PCT No.: PCT/FI2017/050130
§ 371 (c)(1),
(2) Date: Jul. 2, 2019

(87) PCT Pub. No.: WO2018/158488
PCT Pub. Date: Sep. 7, 2018

(65) Prior Publication Data
US 2019/0337138 A1    Nov. 7, 2019

(51) Int. Cl.
| | | |
|---|---|---|
| H05K 7/02 | (2006.01) | |
| H05K 7/04 | (2006.01) | |
| B25F 5/00 | (2006.01) | |
| H05K 1/18 | (2006.01) | |
| H05K 5/00 | (2006.01) | |
| H05K 5/02 | (2006.01) | |
| H05K 7/20 | (2006.01) | |

(52) U.S. Cl.
CPC ............. *B25F 5/008* (2013.01); *H05K 1/181* (2013.01); *H05K 5/0017* (2013.01); *H05K 5/023* (2013.01); *H05K 7/20445* (2013.01)

(58) Field of Classification Search
CPC combination set(s) only.
See application file for complete search history.

(56) References Cited

U.S. PATENT DOCUMENTS

| | | | |
|---|---|---|---|
| 2005/0281627 A1 | 12/2005 | Britz | |
| 2011/0170258 A1 | 7/2011 | Single et al. | |
| 2012/0260456 A1 | 10/2012 | King, Jr. | |
| 2015/0280515 A1* | 10/2015 | Ekstrom | ............... H05K 1/181 173/217 |
| 2016/0204675 A1* | 7/2016 | Yang | ..................... H02K 7/145 361/783 |

(Continued)

FOREIGN PATENT DOCUMENTS

| | | |
|---|---|---|
| CN | 101116236 B | 9/2010 |
| CN | 1853871 B | 4/2011 |
| CN | 102189532 A | 9/2011 |

(Continued)

*Primary Examiner* — Hung S. Bui
(74) *Attorney, Agent, or Firm* — ArentFox Schiff LLP

(57) ABSTRACT

The application concerns a cooling arrangement for a power tool and a power tool comprising the cooling arrangement. According to an aspect of the invention a cooling arrangement for a power tool comprises a housing of the power tool and electronics. The electronics include at least one circuit board and at least one electronic component. The electronics comprise at least one heat conductive area. The at least one heat conductive area is arranged to be heat conductively connected to the housing of the power tool.

20 Claims, 5 Drawing Sheets

(56) References Cited

U.S. PATENT DOCUMENTS

2017/0042314 A1  2/2017 Helton et al.

FOREIGN PATENT DOCUMENTS

| CN | 102124827 B | 7/2015 |
|----|----|----|
| DE | 102008011291 A1 | 9/2009 |
| DE | 102010035169 A1 | 2/2012 |
| DE | 102012223717 A1 | 6/2014 |
| DE | 202014010178 U1 | 2/2015 |
| EP | 2689897 A1 | 1/2014 |
| WO | 2006072489 A1 | 7/2006 |
| WO | 2008066453 A1 | 6/2008 |
| WO | 2013147316 A2 | 10/2013 |

\* cited by examiner

COOLING ARRANGEMENT FOR A POWER TOOL AND POWER TOOL ELECTRONICS

PRIORITY

This application is a U.S. national application of the international application number PCT/FI2017/050130 filed on Feb. 28, 2017, the contents of which are incorporated herein by reference.

TECHNICAL FIELD

The application concerns a cooling arrangement for a power tool and power tool electronics comprising the cooling arrangement.

BACKGROUND

Power tools may be used for many kind of work. For example drilling, cutting, surface tooling, grinding, polishing, and so on. Power tools are being developed. While desired properties, like output, effectiveness and capacity may be achieved, more electronics may be required.

SUMMARY

An object of the application is to provide a cooling arrangement for electronics of a power tool.

According to an aspect of the invention a cooling arrangement for a power tool comprises a housing of the power tool and electronics including at least one circuit board and at least one electronic component. The electronics include at least one heat conductive area. The heat conductive area may comprise a conductive pad of the circuit board, a pin of the electric component, and/or a heat conductive tab of the electronic component. The at least one heat conductive area is arranged in heat conductive connection with the housing of the power tool.

An aspect of the invention relates to a power tool comprising a cooling arrangement according to the previously mentioned aspect.

BRIEF DESCRIPTION OF THE DRAWINGS

In the following embodiments are described with the Figures, of which

DETAILED DESCRIPTION

Power tools have developed in order to respond to different needs for tooling and to enable desired tooling work to be done effectively and handy. Development of tools relates to components of tools. For example, amount of electronics inside tools has increased. Brushless motors may provide effectivity, while posing requirements for electronics. During use electronics or electronic components of a power tool may produce heat. The more electronics, the more heat may be produced. Heat may cause malfunction of electronic components. Fans have been used for cooling electronics, but those may lack effectiveness, at least in demanding situations.

According to embodiments heat produced by electronics is arranged to be transferred away from the electronics, for example to a housing of a power tool. A heat conductor may be arranged to heat conductively connect electronics and the housing of a power tool. The housing may comprise external housing of a tool and/or a shaft. An electrical insulator may be provided in order to prevent electrical conduction to external parts of the power tool. A surface area of heat conductive parts has effect on heat conductivity. As the heat is conducted to a housing of a power tool, a heat conductive area is enlarged and thus the heat conduction is effective. The larger the heat conductive area the more effectively heat is transferred.

A heat conductive area is an electrically and thermally conductive area. The heat conductive area may be part of a component or a circuit board. The heat conductive area may comprise an electronic component, a heat conductive tab of an electronic component and/or a conductive pad of a circuit board. A heat conductor may be connected to the heat conductive area. Heat may be transferred directly from an electronic component, which generates heat, to the heat conductor. Heat may be transferred via the heat conductive tab of the electronic component to the heat conductor. Heat may be transferred via conductive pad(s) or land(s) of the circuit board to the heat conductor.

Figure 1:
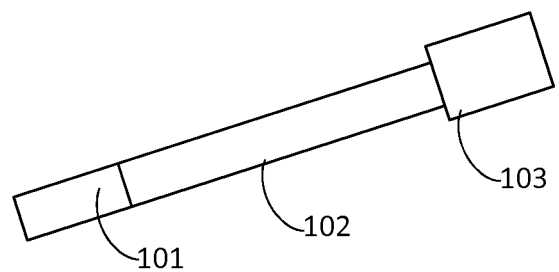
FIG. 1 illustrates a power tool according to an embodiment.

FIG. 1 illustrates a power tool according to an embodiment. Power tool comprises a tool handle 101, a shaft portion 102 and a motor powered tool 103. When used, the tool 103 is placed next to a surface or a place to be tooled. The shaft portion 102 separates the handle 101 from the motor powered tool 103. This enables user to hold and operate the power tool at a distance from the tool 103 and the tooled place. The distance corresponding to the length of the shaft portion 102. The tool 103 may generate dust and dirt during use. Electronics and/or a drive unit may be placed within the handle 101. This enables user to control the power tool while keeping the distance from the tooled place. Further this enables keeping electronics at a distance from the dust and dirt, thereby extending durability, engine life and/or service intervals of motor, electronics and/or other tool parts. Electronics produce heat. Cooling arrangements are described with the following Figures.

A shaft may form part of power tool housing. The shaft may be placed between the motor powered tool and the handle. The shaft may comprise a length between 0.3-2.0 m.

The aspects of the invention apply to different kind of power tools. Power tools may comprise alternative forms and structures. For example, a motor may be placed at the power tool housing next to a tool. Power tool may comprise a housing for a tool and a motor with or without a shaft part.

Figure 2A:
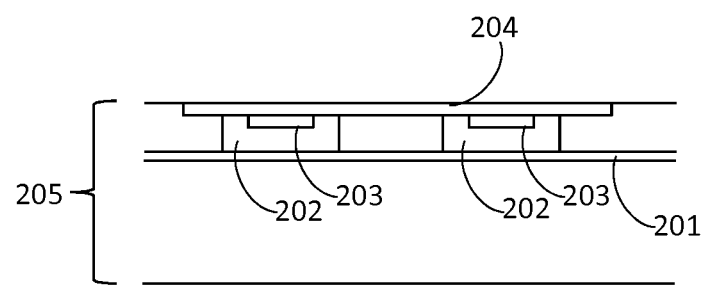
FIG. 2a illustrates a cooling arrangement for a power tool according to an embodiment.
Figure 2B:
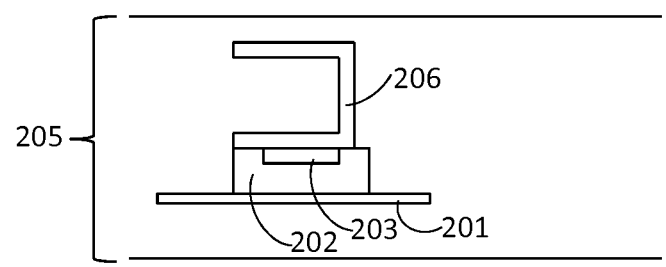
FIG. 2b illustrates a cooling arrangement for a power tool according to an embodiment.

FIG. 2a and FIG. 2b illustrates a heat conductor arrangement for a power tool according to an embodiment. A circuit board 201 may be single sided, double sided or multi-layer circuit board. Multi-layer circuit board enables higher component density compared to single- or double sided circuit boards. Higher density of components may increase heat produced by the components accordingly.

The circuit board 201 is arranged to receive electronic components 202. Electronic components 202 are mechanically and electrically connected to the circuit board 201. An electronic component may comprise pin(s) and/or lead(s) for soldering the electronic component to a surface of the circuit board. An electronic component 202 may be a through-hole component or a leaded component, which is arranged to be mounted via pin(s) or wire lead(s) into hole(s) of a circuit board. Hole(s) of the circuit board keep the components in place. Conductive pads are arranged around the hole(s) for soldering and/or electrically connecting the electronic component(s). Alternatively, an electronic component 202 may be a surface-mount component, which is arranged to be mounted onto a surface of a circuit board. Pins of a surface mount component are arranged to line up with conductive pads of a surface of the circuit board. Both kind of electronic components and/or both mounting techniques may be used on the same circuit board. The electronic component(s) are soldered onto the circuit board 201 in order to provide electric connection.

The component 202 may comprise a heat conductive tab 203. A heat conductive tab is a passive heat exchanger arranged to transfer heat, which is generated by the electronic component. The heat is arranged to be dissipated away from the electronics, e.g. the electronic component 202 and/or the circuit board 201. The heat conductive tab has effect on heat dissipation ability of the electronic component.

The electronic component 202, which has been soldered to the circuit board 201, may comprise a heat conductive tab 203 on its surface, e.g. on the surface parallel with circuit board to which the electronic component 202 has been mounted. The heat conductive tab 203 may comprise a metal tab or other heat conducting material. The heat conductive tab 203 is arranged to conduct heat produced by the electronic component 202. The heat conductive tab 203 is arranged to conduct heat to a housing part 205 of a power tool. The housing part 205 may comprise a shaft, a tool housing and/or a tool handle. The housing, e.g. a shaft illustrated in FIG. 1, enables effective heat conducting via its large area. In FIG. 2a a heat conductive insulator 204 is provided between the heat conductive tab 203 and the housing part 205. The heat conductive insulator 204 prevents electricity from conducting to the housing part 205. Any external parts that a user may contact are electrically insulated. FIG. 2a illustrates a plate-like heat conductive insulator. FIG. 2b illustrates a heat conductor 206 having an angulate U-shaped cross-section. In the FIG. 2b the heat conductor comprise relatively large area due to its shape. In the FIG. 2b heat may be conducted from the heat conductor 206 via air to the housing 205 of the power tool.

Figure 3A:
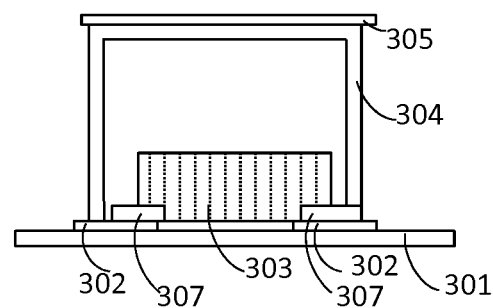
FIG. 3a illustrates a cooling arrangement for a power tool according to an embodiment.

FIG. 3a illustrates a cooling arrangement for a power tool according to an embodiment. A electronic component 303 is soldered to a circuit board 301. The pins 307 of the electronic component 303 are soldered on conductive pads 302 of the circuit board 301. The conductive pads 302 may comprise copper. The electronic component 303 produces heat. The heat conducts to the circuit board 301, especially to the conductive pads 302, which typically is good conductor for heat as well as electricity. In order to avoid extensive heating and possible malfunctions or problems caused by it, a cooling arrangement may be provided. In the FIG. 3a a heat conductor 304 is arranged to be mounted both to a conductive pad 302 of the circuit board and to a pin 307 of the electronic component. The heat produced by the electronic component 303 is conducted via the pins 307 and/or the conductive pad 302 of the circuit board 301 to the heat conductor 304. Heat conductor 304 is arranged in conductive contact with a housing of a power tool in order to provide more heat conductive area and make the heat conductivity more effective. An electrical insulator 305, that is heat conductive, may be provided between the heat conductor 304 and the housing. In the FIG. 3a the heat conductor 304 comprises a shape of an angulated letter U. One end point of the angulated U-shaped heat conductor 304 is mounted to the circuit board 301 or heat conductive pad 302 of it, and the other end point of the angulated U-shaped heat conductor 304 is mounted to the pin 307 of the electronic component. A heat conductor may comprise other shapes and it may be arranged to encapsulate two or more electronic components. This may be implemented for a row- or a line of electronic components.

Figure 3B:
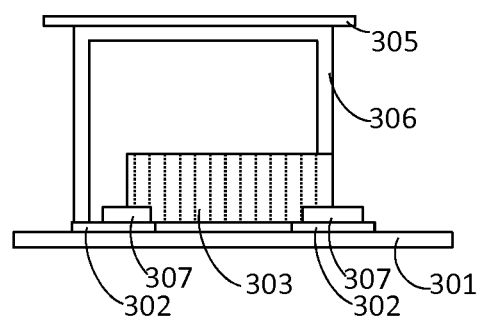
FIG. 3b illustrates a cooling arrangement for a power tool according to an embodiment.

FIG. 3b illustrates a cooling arrangement for a power tool according to an embodiment. An electronic component 303 is soldered to a circuit board 301 as in the FIG. 3a. A heat conductor 306 is arranged to be mounted or soldered to the conductive pad 302 of the circuit board 301 on its one end, and to the electronic component 303 on its other end. The heat conductor 306 may be mounted on the heat conductive tab of the electronic component 303. The heat conductor 306 is arranged in a heat conductive connection with the conductive pad 302 and the electronic component, as well as with a housing of the power tool. The form of the heat conductor 306 may correspond to angulated letter J. Thus, one branch of the heat conductor 306, attachable to an electronic component, is shorter than the other branch of the heat conductor 306, attachable to a circuit board. The heat conductor 306 is arranged to conduct heat to a housing of a power tool. An electrical insulator 305 may be arranged between the heat conductor 306 and the housing.

Figure 3C:
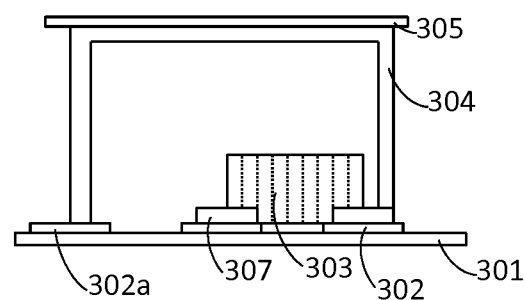
FIG. 3c illustrates a cooling arrangement for a power tool according to an embodiment.
Figure 3D:
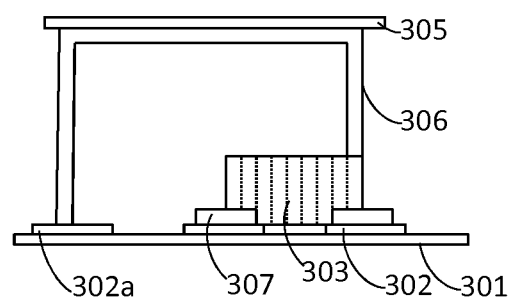
FIG. 3d illustrates a cooling arrangement for a power tool according to an embodiment.

FIGS. 3c and 3d illustrate a cooling arrangement for a power tool according to an embodiment. As in the FIGS. 3a and 3b, an electronic component 303 is soldered to a circuit board 301. A branch of a heat conductor 304, 306 is arranged to be heat conductively mounted and/or soldered to the conductive pad 302a of the circuit board 301. Another branch of the heat conductor 304 is arranged in heat conductive connection with a pin 307 of the electronic component 303, as illustrated in the FIG. 3c. In the FIG. 3d another branch of the heat conductor 306 is arranged in heat conductive connection with an electronic component 303 or a heat conductive tab of such. At least one end of a heat conductor 304, 306 may be mounted to a conductive pad 302a of the circuit board 301.

A heat conductor may comprise alternative kind of heat conductors, other than illustrated in the FIGS. 3a, 3b, 3c and 3d. A heat conductor may comprise three or more branches in order to heat conductively connect to a to electronic component; circuit board; and/or to a conductive pad, which is the same or different to which the electronic component is soldered. Branch ends of a heat conductor may be soldered to a circuit board, to a conductive pad(s) of the circuit board, to a heat conductive tab or pin of an electronic component and/or to an electronic component. The heat conductor is arranged to heat conductively contact and/or conduct heat to a housing portion. The housing may comprise a tool housing and/or a shaft. This may provide efficiency to the heat conductivity and/or enable different or stabile structure.

An electronic component may comprise a transistor, a thyristor, a switch, a resistor, a transformer, a capacitor, a coil, a diode, or any other electronic component.

Figure 4A:
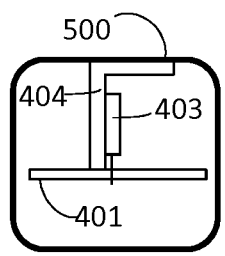
FIG. 4a illustrates a cooling arrangement for a power tool according to an embodiment.

FIG. 4a illustrates a cooling arrangement for a power tool according to an embodiment. An electronic component 403 comprises one or more leads, which is mounted to a circuit board 401. The one or more leads may be mounted into holes of the circuit board and soldered on either side of the circuit board 401, or on both sides of the circuit board 401. The electronic component 403 comprises a heat conductive tab or a surface portion for cooling. The heat conductive tab may be on a side surface of the electronic component. As illustrated in the FIG. 4a, the side surface of the electronic component may be perpendicular to the circuit board surface, onto which the electronic component is mounted. The heat conductive tab enables heat produced by the electronic component to be dissipated away from the electronic component 403. The heat conductor 404 is mounted to the circuit board 401. A surface of a heat conductor 404 is arranged in heat conductive contact with the heat conductive tab of the electronic component 403 and/or with the surface of the electronic component 403 comprising the heat conductive tab. The heat is conducted via the heat conductive tab to the heat conductor 404. The heat conductor is arranged in heat conductive contact with a power tool housing 500. The heat is conducted via the heat conductor 404 to the power tool housing 500. The heat conductor 404 comprises a shape of a letter L. A leg of an L-shaped heat conductor 404 is arranged in heat conductive connection with an electronic component, and another leg of the L-shaped electronic component is arranged in heat conductive connection with a power tool housing. The heat conductor may be in contact with the electronic component. An electronic insulator may be provided between the heat conductor 404 and the power tool housing 500.

Figure 4B:
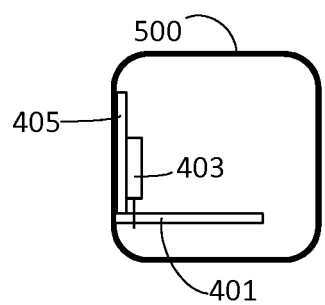
FIG. 4b illustrates a cooling arrangement for a power tool according to an embodiment.

FIG. 4b illustrates a heat conductor arrangement for a power tool according to an embodiment. An electronic component 403 comprises one or more leads via which it is mounted to a circuit board 401. The one or more leads may be placed into holes of the circuit board 401 and soldered on either one side or on both sides of the circuit board 401. The electronic component 403 comprises a heat conductive tab for cooling the component. This enables cooling the electronic component 403, when heat is produced. A heat conductor 405 is mounted to a circuit board 401. A surface of the heat conductor 405 is arranged in a heat conductive contact with the heat conductive tab of the electronic component 403, or with the surface of the electronic component 403 comprising the heat conductive tab. Another surface of the heat conductor 405, e.g. an opposing surface as illustrated in the FIG. 4b, is arranged in a heat conductive contact with a power tool housing 500. The heat is conducted via the heat conductive tab to the heat conductor 405; and via heat conductor 405 to a power tool housing 500. The heat conductor 405 of FIG. 4b comprises a shape of a letter I. An I-shaped heat conductor may be arranged in heat conductive contact with an electronic component on its longitudinal side, and in heat conductive contact with a power tool housing on the opposing longitudinal side of the I-shaped heat conductor. Heat conductor may be in contact with the electronic component and/or heat conductive tab of it. An electronic insulator may be provided between the heat conductor 405 and the power tool housing 500.

Figure 4C:
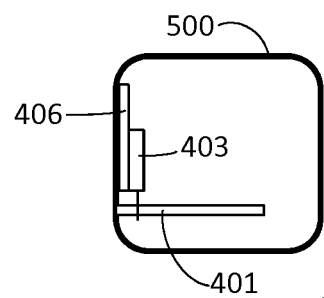
FIG. 4c illustrates a cooling arrangement for a power tool according to an embodiment.

FIG. 4c illustrates a heat conductor arrangement for a power tool according to an embodiment. An electronic component 403 comprises one or more leads via which it is mounted into holes of a circuit board 401. The electronic component 403 may be soldered via a through hole. In addition or alternatively the electronic component 403 may be soldered on either side of the circuit board 401, or on both sides of the circuit board 401. The electronic component 403 comprises a heat conductive tab. This enables dissipation of heat away from the electronic component 403. A heat conductor 406 is arranged to be heat conductively attached to the electronic component 403 and/or to heat conductive tab. The heat conductor 406 is heat conductively attached to a power tool housing 500. For example conducting paste or adhesive may be used to attach the heat conductor 406 surface to the electronic component 403 and/or to a surface of power tool housing 500. A surface of the heat conductor 406 is arranged in heat conductive contact with the electronic component 403 or the heat conductive tab of the electronic component 403. The heat is dissipated via the heat conductive tab to the heat conductor 406; and via the heat conductor 406 to a power tool housing 500. The heat conductor 406 comprises a shape of a letter I. A longitudinal side of the I-shaped heat conductor 406 may be in contact with electronic component 403 and/or the heat conductive tab. A side, for example another longitudinal side of the I-shaped heat conductor 406, may be connected to the power tool housing 500 in a heat conductive manner. An electric insulator may be provided between the heat conductor 404 and the power tool housing 500 and/or between the electronic component 403 and the heat conductor 406.

Contact means of an electronic component, enabling electrical soldering to a circuit board, may be called a lead, a wire or a pin.

A power tool may comprise a dust suction arrangement, which is arranged to extract dust produced by tooling. For example, a shaft of a power tool may be arranged to work as a suction pipe. The suction/extraction contributes to the cooling of the power tool. Part of the housing, like a tool housing and/or a shaft, which is arranged to conduct heat from the electronics according to aspects of the invention may warm a bit at certain situations. Where suction pipe is arranged, for example to the same shaft, to a separated internal pipe in the shaft, the suction cools down the housing. The power tool comprises a dust suction arrangement, which is arranged to extract dust produced by the motor powered tool during tooling, and which is arranged to participate in cooling down the power tool. Heat is conducted from the electronics to the housing of the power tool. The housing is cooled with aid of dust suction/extraction arrangement. The shaft is arranged to work as a suction pipe, and the suction is arranged to cool down the power tool.

Aspects of the invention enable simple and effective cooling of electronics, like a circuit board and/or electronic components. A surface area of a power tool housing or shaft is utilized to conduct heat away from electronics. Enlarged heat conductive area enables boosting heat conducting from electronics.

A circuit board is arranged to receive electronic components. The circuit board is arranged to mechanically support and to electrically connect the electronic components. The circuit board may comprise a printed circuit board, a one sided circuit board, a two sided circuit board or a multilayer circuit board. Electronic components may be soldered and/or screwed to the circuit board. The soldered electronic components on the circuit board are mechanically fixed and electrically conducting.

An electronic component may comprise a heat conductive tab. The heat conductive tab may comprise copper. A electronic component may comprise a heat conductive tab on at least one side. For example a surface mountable electronic component may comprise a heat conductive tab on a side parallel with the circuit board surface, onto which it is mounted. As another example, a through-hole component may comprise a heat conductive tab on a side perpendicular and/or parallel with the circuit board surface onto which it is mounted. Any side of a through hole mountable electronic component may comprise a heat conductive tab.

A heat conductor and/or a heat conductive area comprises heat conductive material. The heat conductive material may comprise copper, aluminium, iron, carbon fibre, or any other heat conductive material. A housing or a shaft of a power tool is arranged to conduct the heat conducted via the heat conductor or via the heat conductive area. The housing or the shaft may comprise heat conductive material. For example the same or alike material as the heat conductor or the heat conductive area.

A heat conductor may comprise different shapes. For example, a letter U, an angulated letter U, a letter I, a letter J, an angulated letter J, a letter m or any other suitable form. A heat conductor may comprise two or more branches, ends of which may be arranged to be mounted to a circuit board and/or to an electronic component. A heat conductor may be arranged to encapsulate two or more electronic components. For example a heat conductor may be arranged to conduct heat from two, or from three, or from a row, or from a line of electronic components. Several different kind of heat conductors may be arranged on a circuit board.

An electrical insulator may be provided between a heat conductor and a housing of a power tool. The electrical insulator insulates electricity and is arranged to conduct heat. The electric insulator may comprise paste, silicone elastomer, ceramic material or air. The electric insulator may comprise other material and/or form. Electricity is insulated from a power tool housing or shaft. It is possible to conduct heat (and electricity) straight to the power tool housing or shaft, if external parts of the power tool are electrically insulated. User may touch external parts of the power tool, thus electrical insulation of such parts is accomplished.

Mounting, attaching, fixing and other ways of connecting any of the components may comprise a solder joint, a metal joint, an adhesive joint, a paste joint or any other suitable joint. A joint may be heat conducting. Straight contact, without any pieces in the middle may enable better conductivity. In order to provide electrical insulation between heat conducting portion(s) and external part of the power tool, some electric insulation may be used. For example air gap may between parts be used for electric insulation between the parts. Heat conduction via air may be effective, if large conductive surface is arranged. Heat conduction via air may be enhanced by providing ventilation.

The invention claimed is:

1. A cooling arrangement for a power tool, comprising:
a housing of the power tool;
electronics including at least one circuit board and at least one electronic component; and
the electronics including at least one heat conductive area, wherein the at least one heat conductive area is arranged to be heat conductively connected to the housing of the power tool, and wherein the housing of the power tool comprises a shaft arranged between a handle and a motor powered tool, and wherein the shaft is arranged to work as a suction pipe to extract dust produced during operation of the power tool, and the suction is arranged to cool down the power tool.

2. The cooling arrangement according to claim 1, wherein the at least one circuit board and/or the at least one electronic component comprises the at least one heat conductive area.

3. The cooling arrangement according to claim 1, wherein the heat conductive area comprises at least one of:
the at least one electronic component;
a conductive pin of the at least one electronic component;
a heat conductive tab of the at least one electronic component; and
conductive pad(s) of the circuit board.

4. The cooling arrangement according to claim 1, comprising a heat conductor arranged in heat conductive contact with the at least one heat conductive area, and arranged in heat conductive contact with the housing of the power tool.

5. The cooling arrangement according to claim 4, wherein the heat conductor comprises copper, aluminium, iron, carbon fibre, or any other heat conductive material.

6. The cooling arrangement according to claim 4, wherein the heat conductor is arranged in direct contact with at least two or more heat conductive areas.

7. The cooling arrangement according to claim 4, wherein the heat conductor comprises a plane and branches extending from one side of the plane.

8. The cooling arrangement according to claim 4, wherein the heat conductor comprises a shape of one of: a letter I, a letter U, an angulated letter U, a letter J, an angulated letter J, a letter m or other suitable shape.

9. The cooling arrangement according to claim 4, comprising an electric insulator arranged between the at least one heat conductive area and an external surface of the housing of the power tool.

10. The cooling arrangement according to claim 9, wherein the heat conductor is arranged in heat conductive contact with the housing of the power tool via the electric insulator.

11. The cooling arrangement according to claim 9, wherein the electric insulator comprises heat conductive, electric insulating material.

12. The cooling arrangement according to claim 11, wherein the electric insulator comprises paste, silicon elastomer, ceramic material or air.

13. The cooling arrangement according to claim 1, wherein an electric insulator is arranged as an external surface of the housing of the power tool.

14. The cooling arrangement according to claim 1, wherein the housing of the power tool comprises heat conductive material.

15. The cooling arrangement according to claim 1, wherein the power tool comprises a motor and the electronics for controlling the motor.

16. The cooling arrangement according to claim 15, wherein the handle comprises the motor.

17. The cooling arrangement according to claim 15, the power tool comprising a dust suction arrangement, which is arranged to extract dust produced by the motor powered tool during tooling, and which is arranged to participate in cooling down the power tool.

18. The cooling arrangement according to claim 1, wherein the housing of the power tool comprises several mounted parts.

19. The cooling arrangement according to claim 1, wherein the housing of the power tool comprises at least a tool housing and the shaft.

20. The power tool comprising a cooling arrangement according to claim 1.

* * * * *